US007791893B2

(12) United States Patent
Champion et al.

(10) Patent No.: US 7,791,893 B2

(45) Date of Patent: Sep. 7, 2010

(54) ARRANGEMENT FOR POWERING USB KEYS

(75) Inventors: David F. Champion, Durham, NC (US); William R. Duffy, III, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 797 days.

(21) Appl. No.: 11/682,487

(22) Filed: Mar. 6, 2007

(65) Prior Publication Data

US 2008/0220636 A1 Sep. 11, 2008

(51) Int. Cl.
*H05K 1/14* (2006.01)

(52) U.S. Cl. ....................................... 361/737; 361/752

(58) Field of Classification Search ................. 361/737, 361/727, 752, 790, 797, 800
See application file for complete search history.

(56) References Cited

U.S. PATENT DOCUMENTS 5,170,431 A * 12/1992 Dawson et al. .............. 380/259
7,133,296 B2 * 11/2006 Choi et al. .................. 361/798
7,359,208 B2 * 4/2008 Ni .............................. 361/752
2009/0066087 A1 * 3/2009 Van Huffel .................. 290/54

FOREIGN PATENT DOCUMENTS

JP 2004-241956 A * 8/2004

* cited by examiner

*Primary Examiner*—Hung S Bui
(74) *Attorney, Agent, or Firm*—Cantor Colburn LLP; Feb Cabrasawan

(57) ABSTRACT

Charging or recharging a capacitor powers a USB key. The capacitor is connected to the USB plug. Inserting the key in a powered device charges or recharges the capacitor. Alternatively, the capacitor is connected to the USB plug and a rotatable generator electrically is connected to the capacitor. A sliding gear having teeth engages with complimentary teeth of the generator. A spring disposed at each end of the sliding gear to restrain the sliding movement of the gear. Movement of the sliding gear kinetically charges or recharges the capacitor. The USB key can include the capacitor alone or the kinetic arrangement or the combination of the capacitor and the kinetic arrangement.

3 Claims, 1 Drawing Sheet

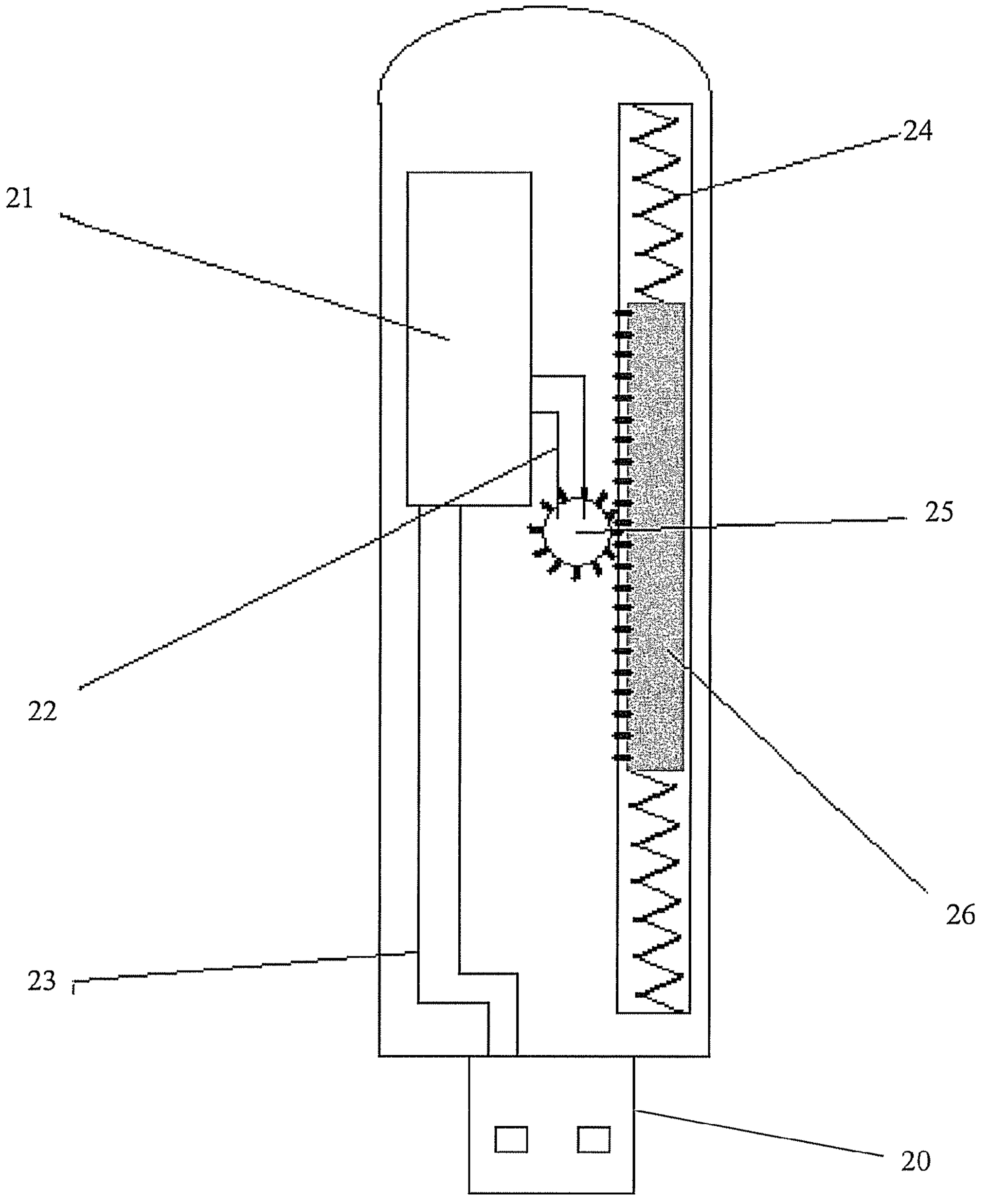
24
21
25
22
26
23
20

ARRANGEMENT FOR POWERING USB KEYS

BACKGROUND OF THE INVENTION

1. Field of the Invention

This invention relates to an arrangement for powering a USB key and particularly to an arrangement for powering a USB key that substantially avoid the use of a battery to power the USB key.

2. Description of Background

Presently, USB keys have powered displays. The power is derived from a battery. This arrangement makes the key large. In addition, the battery is generally non-chargeable and must be periodically replaced. Generally, battery life is not more than twelve hours of continuous usage.

SUMMARY OF THE INVENTION

The shortcomings of the prior art are overcome and additional advantages are provided through the provision of a capacitor as the source of power for the USB key. In a first example or embodiment an arrangement for powering a USB key comprises a capacitor connected to the USB plug. In a second example or embodiment an arrangement for powering a USB key comprising a capacitor connected to a USB plug and a rotatable generator electrically connected to the capacitor. A sliding gear having teeth engages with complimentary teeth of the generator. A spring disposed at each end of the sliding gear to restrain the sliding movement of the gear.

BRIEF DESCRIPTION OF THE DRAWINGS

The single FIGURE illustrates the first and second examples or embodiments of the invention in which a capacitor is connected to a USB plug and a rotatable generator electrically connected to the capacitor.

The detailed description explains the examples or embodiments of the invention, together with advantages and features, by way of reference to the drawing.

DETAILED DESCRIPTION OF THE INVENTION

The single FIGURE illustrates the first and second examples or embodiments of the invention. The FIGURE illustrates a USB having a plug 20. Disposed within the USB is a capacitor on a board 21. Wiring 23 connects the plug 20 to the capacitor on board 21. A rotatable generator 25, such as a microgenerator, is connected to the capacitor on board 21 by wiring 22. Generator 25 has peripheral teeth forming a gear that engage with corresponding gear teeth on a geared slide 26. Disposed at each end of gear 26 is a spring 24 that restrains the sliding of gear 26.

The capacitor on board 21 can be charged or recharged in a first example or embodiment every time the USB key is inserted in a powered device. The capacitor on board 21 in a second example or embodiment can be charged or recharged kinetically by rotation of the microgenerator 25 when the teeth of sliding of gear 26 engage the complimentary teeth of the microgenerator. The microgenerator 25 is rotated whenever the gear 26 slides. The gear 26 is weighted and restrained from sliding by springs 24. Movement of the key will cause the gear 26 to slide. The user, for example, can cause sliding of gear 26 as the key is carried to permit the microgenerator to power the capacitor on board 21.

The key can comprise either of the first and second examples or embodiments or both the first and second examples and embodiments.

The arrangement of a microgenerator and a sliding gear to kinetically charge or recharge a capacitor power is well known in watches. According to the watch industry watches that have kinetically charged or recharged capacitors can function for up to four months without a recharge. The capacitor on the key supplies voltage for the display or other powered options on the key.

The charge or recharging of the capacitor is fairly rapid by either the first or second example or embodiment. Plugging the key into any powered device will give almost instantaneous and full recharge to the capacitor. In the kinetic arrangement, charging or recharging will be continuous so long as the sliding gear is moving.

The power provided by the capacitor can be used to supply power to various USB key options or displays, to include FM receivers, voice recorders or many other devices that instead use a battery as a source of power for the key. Either the first or second example or embodiment or a combination of the first and second example or embodiment would have no affect on the key conforming to the USB 2.0 standard.

If only small amounts of power are needed briefly, such as to display the amount of spare storage on the key, an alternative is to supply the key with a grip point made of piezoelectric material which, when squeezed, generates a brief but sufficient charge.

The advantages over the existing battery usage include: (1) smaller key size since the capacitive power supply is less bulkier than powered keys using one or more batteries and regardless of battery size; (2) little need for maintenance of the key; (3) little need for replacement of the power source; and (4) substantially no limit to continuous use as the capacitor can be charged or recharged by insertion in a powered device or kinetically by movement.

While the examples or embodiments of the invention have been described, it will be understood that those skilled in the art, both now and in the future, may make various improvements and enhancements which fall within the scope of the claims winch follow. These claims should be construed to maintain the proper protection for the invention first described.

What is claimed is:

1. An arrangement for powering a USB key comprising:

a capacitor connected to a USB plug;

a rotatable generator electrically connected to the capacitor;

a sliding gear having teeth that engages with complimentary teeth of the generator; and a spring disposed at each end of the sliding gear to restrain the sliding movement of the gear;

wherein the generator is electrically connected in parallel with the capacitor and the USB plug.

2. The arrangement according to claim 1 wherein the gear is weighted and the springs restrain the sliding of the gear.

3. An arrangement for powering a USB key comprising:

a capacitor connected to a USB plug;

a rotatable generator electrically connected to the capacitor;

a sliding gear having teeth that engages with complimentary teeth of the generator; and a spring disposed at each end of the sliding gear to restrain the sliding movement of the gear.

* * * * *